United States Patent
Yamada

(10) Patent No.: US 12,538,780 B2
(45) Date of Patent: Jan. 27, 2026

(54) ISOLATOR

(71) Applicants: Kabushiki Kaisha Toshiba, Tokyo (JP); Toshiba Electronic Devices & Storage Corporation, Tokyo (JP)

(72) Inventor: Masaki Yamada, Oita Oita (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 403 days.

(21) Appl. No.: 18/178,448

(22) Filed: Mar. 3, 2023

(65) Prior Publication Data

US 2024/0105592 A1 Mar. 28, 2024

(30) Foreign Application Priority Data

Sep. 22, 2022 (JP) .................................. 2022-151235

(51) Int. Cl.
  *H01L 23/522* (2006.01)
  *H01F 27/28* (2006.01)
  *H01L 21/762* (2006.01)
  *H01L 21/768* (2006.01)

(52) U.S. Cl.
  CPC ..... *H01L 23/5226* (2013.01); *H01F 27/2804* (2013.01); *H01L 21/76243* (2013.01); *H01L 21/76831* (2013.01); *H01L 23/5227* (2013.01); *H01L 21/76224* (2013.01)

(58) Field of Classification Search
  CPC ............. H01L 23/5227; H01L 23/5226; H01L 23/645; H01L 23/49822; H01L 21/76243; H01L 21/76831; H01L 21/76224; H01F 27/2804
  See application file for complete search history.

(56) References Cited

U.S. PATENT DOCUMENTS

| 9,735,110 B2 | 8/2017 | Nakagawa et al. |
| 11,011,297 B2 | 5/2021 | Osada et al. |
| 2005/0230837 A1* | 10/2005 | Taghizadeh-Kaschani ................ H01L 23/585 257/760 |
| 2006/0068589 A1 | 3/2006 | Bian |
| 2007/0134907 A1 | 6/2007 | Ikeda et al. |

(Continued)

FOREIGN PATENT DOCUMENTS

| JP | 2005-347472 A | 12/2005 |
| JP | 2006-100835 A | 4/2006 |

(Continued)

*Primary Examiner* — Zandra V Smith
*Assistant Examiner* — John M Parker
(74) *Attorney, Agent, or Firm* — Kim & Stewart LLP

(57) ABSTRACT

An isolator includes a substrate; a first insulating film on the substrate; a second insulating film on the first insulating film, a third insulating film on the second insulating film, a first interconnect in the second insulating film, and first and second coils. The first interconnect has a thickness equal to a film thickness of the second insulating film. The first coil extends in the first and second insulating films. The first coil has a length in the extending direction greater than the thickness of the first interconnect. The third insulating film is provided on the second insulating film, and covers the first interconnect and the first coil. The second coil is provided on the third insulating film, and faces the first coil via the third insulating film.

12 Claims, 5 Drawing Sheets

(56) References Cited

U.S. PATENT DOCUMENTS

| | | | |
|---|---|---|---|
| 2007/0148953 A1 | 6/2007 | Itani et al. | |
| 2007/0218680 A1 | 9/2007 | Itani et al. | |
| 2010/0078780 A1 | 4/2010 | Nakao et al. | |
| 2011/0175193 A1* | 7/2011 | Nakagawa | H01L 23/53295 257/E23.161 |
| 2011/0222188 A1 | 9/2011 | Etoh et al. | |
| 2012/0248544 A1 | 10/2012 | Yokoyama | |
| 2020/0294786 A1* | 9/2020 | Yamada | H01L 21/0217 |

FOREIGN PATENT DOCUMENTS

| | | |
|---|---|---|
| JP | 2007-129003 A | 5/2007 |
| JP | 2007-180420 A | 7/2007 |
| JP | 2007-258195 A | 10/2007 |
| JP | 2009-259967 A | 11/2009 |
| JP | 2010-080772 A | 4/2010 |
| JP | 2010-080773 A | 4/2010 |
| JP | 2010-080774 A | 4/2010 |
| JP | 2011-192348 A | 9/2011 |
| JP | 2012-216776 A | 11/2012 |
| JP | 2016-028407 A | 2/2016 |
| JP | 2019-016799 A | 1/2019 |
| WO | 2010/035481 A1 | 4/2010 |

\* cited by examiner

ISOLATOR

CROSS-REFERENCE TO RELATED APPLICATIONS

This application is based upon and claims the benefit of priority from Japanese Patent Application No. 2022-151235, filed on Sep. 22, 2022; the entire contents of which are incorporated herein by reference.

FIELD

Embodiments relate to an isolator.

BACKGROUND

It is desirable for isolators used in power control to be inexpensive.

DETAILED DESCRIPTION

Figure 1:
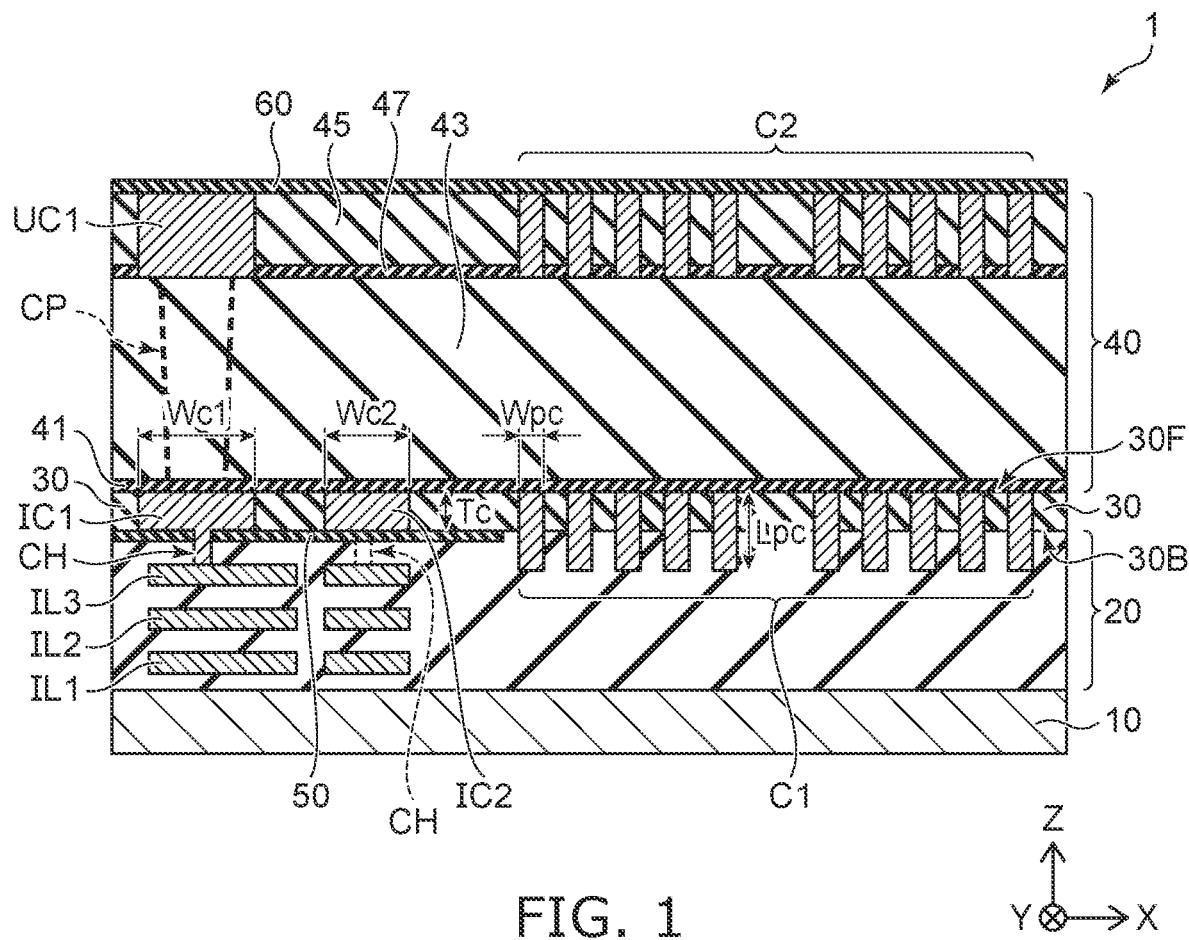
FIG. 1 is a schematic cross-sectional view showing an isolator according to an embodiment.

According to one embodiment, an isolator includes a substrate; a first insulating film provided on the substrate; a second insulating film provided on the first insulating film, the second insulating film including a back surface and a front surface, the back surface facing the first insulating film, a front surface being at a side opposite to the back surface; a first interconnect provided in the second insulating film, a thickness of the first interconnect being equal to a film thickness of the second insulating film in a first direction directed toward the second insulating film from the substrate; a first coil extending in the second insulating film and the first insulating film, the first coil having a length in the first direction from the front surface of the second insulating film into the first insulating film, the length in the first direction of the first coil being greater than the thickness in the first direction of the first interconnect; a third insulating film provided on the second insulating film, the third insulating film covering the first interconnect and the first coil, the third insulating film including a back side and a front side opposite to the back side, the back side of the third insulating film facing the second insulating film; and a second coil provided at the front side of the third insulating film, the second coil facing the first coil via the third insulating film.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

FIG. 1 is a schematic cross-sectional view showing an isolator 1 according to an embodiment. The isolator 1 is configured to transmit a signal from a primary side to a secondary side via magnetic coupling between a primary coil (hereinbelow, a first coil C1) to a secondary coil (hereinbelow, a second coil C2).

As shown in FIG. 1, the isolator 1 includes a substrate 10, a first insulating film 20, a second insulating film 30, a third insulating film 40, a first interconnect IC1, a second interconnect IC2, the first coil C1, and the second coil C2.

The first insulating film 20 is provided on the substrate 10. The second insulating film 30 is provided on the first insulating film 20. The substrate 10 is, for example, a silicon substrate. The first insulating film 20 is, for example, an inter-layer insulating film. The first insulating film 20 and the second insulating film 30 are, for example, silicon oxide films.

The first insulating film 20 includes, for example, inter-layer interconnects IL1 to IL3. For example, a control circuit (not illustrated) is provided at the front side of the substrate 10 that faces the first insulating film 20. The interlayer interconnects IL1 to IL3 are connected to the control circuit (not-illustrated).

The first coil C1 extends in the first and second insulating films 20 and 30. In other words, the first coil C1 extends into the first insulating film 20 from the front surface 30F side of the second insulating film 30. The front surface 30F of the second insulating film 30 is positioned at the side opposite to a back surface 30B of the second insulating film 30 that faces the first insulating film 20. The first coil C1 is, for example, a metal wire that includes copper, aluminum, etc.

The third insulating film 40 is provided on the second insulating film 30. The second coil C2 is provided at the front side of the third insulating film 40. The front side of third insulating film 40 is the side opposite to the back surface of the third insulating film 40 that faces the second insulating film 30. The first coil C1 and the second coil C2 face each other with the third insulating film 40 interposed. In other words, the second coil C2 is magnetically coupled to the first coil C1 via the third insulating film 40.

The first interconnect IC1 and the second interconnect IC2 are provided in the second insulating film 30. The first interconnect IC1 and the second interconnect IC2 are, for example, metal lines that include copper, aluminum, etc. The first and second interconnects IC1 and IC2 each have a thickness Tc in a first direction, e.g., a Z-direction, directed from the substrate 10 toward the second insulating film 30. The thickness Tc is equal to the film thickness in the Z-direction of the second insulating film 30. The first interconnect IC1 has a first width Wc1 in a second direction, e.g., an X-direction, that is along the front surface 30F of the second insulating film 30. The second interconnect IC2 has a second width Wc2 in the X-direction.

The first coil C1 has a length Lpc in the Z-direction from the front surface 30F of the second insulating film 30 into the first insulating film 20. The length Lpc of the first coil C1 is greater than the thickness Tc of the first and second interconnects IC1 and IC2. The first coil C1 has, for example, a line width Wpc in the X-direction. The line width Wpc of the first coil C1 is less than the width Wc1 of the first interconnect IC1 and the width Wc2 of the second interconnect IC2.

The third insulating film 40 covers the first coil C1, the first interconnect IC1, and the second interconnect IC2. The third insulating film 40 includes, for example, a first film 41, a second film 43, a third film 45, and a fourth film 47.

The first film 41 is provided on the second insulating film 30. The first film 41 is, for example, a surface protection film. The first film 41 is, for example, a silicon nitride film. The first film 41 is provided to prevent metal atoms from moving into the third insulating film 40 from the first coil C1, the first interconnect IC1, and the second interconnect IC2.

The second film 43 is provided on the first film 41. The second film 43 is provided to maintain a high breakdown voltage between the first coil C1 and the second coil C2. The second film 43 has a thickness of, for example, 5 to 10 micrometers. Therefore, the second film 43 preferably includes a material such that the internal stress is small in the film. The second film 43 is, for example, a SiON film.

The third film 45 is provided on the second film 43. The second coil C2 is provided in the third film 45. The third film 45 is, for example, a silicon oxide film. The second coil C2 is, for example, a metal wire embedded in the third film 45. The second coil C2 includes, for example, copper or aluminum.

The fourth film 47 is provided between the second film 43 and the third film 45. The fourth film 47 is provided as, for example, an etching-stop film. Thereby, it is possible to prevent the second film 43 from etching while forming the trench for embedding the second coil C2 (see FIG. 5A). The fourth film 47 is, for example, a silicon nitride film.

The isolator 1 further includes an upper layer terminal UC1, a fourth insulating film 50, and a fifth insulating film 60. The upper layer terminal UC1 is provided in the third film 45 of the third insulating film 40. The fourth insulating film 50 is provided between the first insulating film 20 and the second insulating film 30. The fifth insulating film 60 is provided on the third insulating film 40.

The upper layer terminal UC1 is provided at the same level as the second coil C2 and includes the same material as the second coil C2. The upper layer terminal UC1 is electrically connected to the first interconnect IC1 via a contact plug CP extending in the first and second films 41 and 43 of the third insulating film 40. The upper layer terminal UC1 is electrically connected to, for example, a control circuit (not illustrated) via the contact plug CP, the first interconnect IC1, and the interlayer interconnect IL3.

The fourth insulating film 50 is different in the composition from the second insulating film 30. Also, the fourth insulating film 50 is different in the composition from the first insulating film 20. The fourth insulating film 50 is, for example, a silicon nitride film. The fourth insulating film 50 serves as an etching stopper film when forming the trench for embedding the first interconnect IC1 and the second interconnect IC2 in the second insulating film 30 (see FIG. 4A). The first interconnect IC1 and the second interconnect IC2 are provided between the third insulating film 40 and the fourth insulating film 50. The first interconnect IC1 and the second interconnect IC2 contact the third insulating film 40 and the fourth insulating film 50. The fourth insulating film 50 is located at a position not contacting the first coil C1.

The first interconnect IC1 and the second interconnect IC2 each are connected to the interlayer interconnect IL3 via contact holes CH provided in the first insulating films 20 and the fourth insulating film 50. The first interconnect IC1 is connected to a control interconnect (not-illustrated) via the interlayer interconnect IL3. Also, the second interconnect IC2 is connected to, for example, the potential (the reference potential) of the substrate 10 via the interlayer interconnect IL3.

The fifth insulating film 60 is provided on the third insulating film 40. The fifth insulating film 60 covers the second coil C2 and the upper layer terminal UC1. The fifth insulating film 60 is provided to prevent metallic elements from moving into higher layers (not illustrated) from the second coil C2 and the upper layer terminal UC1.

Figure 2:
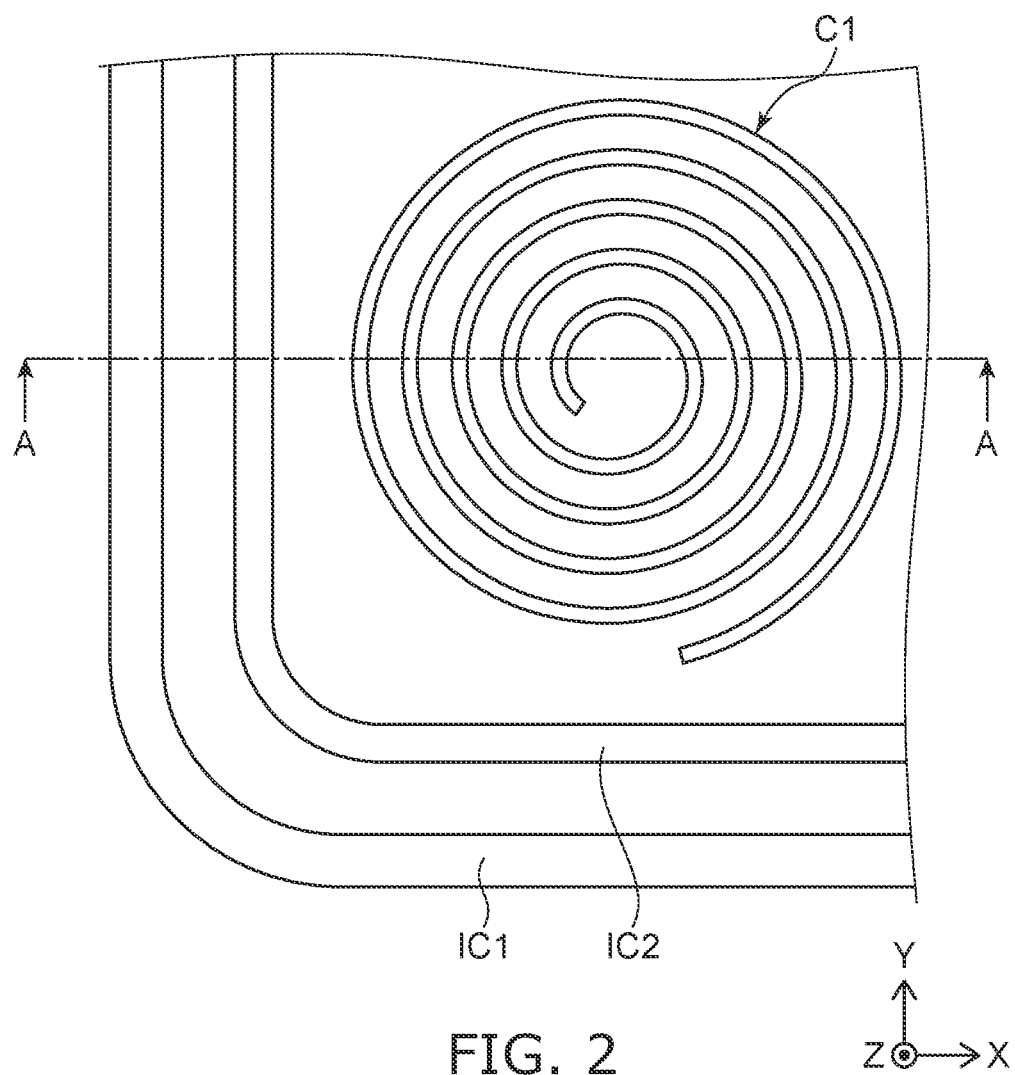
FIG. 2 is a schematic plan view showing the isolator according to the embodiment.

FIG. 2 is a schematic plan view showing the isolator 1 according to the embodiment. FIG. 2 is a partial plan view partially showing the layout of the primary side. FIG. 1 is a cross-sectional view along line A-A shown in FIG. 2.

As shown in FIG. 2, the first coil C1 is a spiral-shaped planar coil. The first interconnect IC1 and the second interconnect IC2 are located proximate to the first coil C1. The first interconnect IC1 and the second interconnect IC2 surround, for example, at least one first coil C1 in the plan view. The second coil C2 has the same planar shape as the first coil C1.

For example, to increase the efficiency of the magnetic coupling between the first coil C1 and the second coil C2, it is sufficient to increase the number of turns of the first and second coils C1 and C2. However, the coil size increases as the number of turns is increased. Therefore, the first and second coils C1 and C2 each have preferably the narrow line width Wpc, but the electrical resistance of each coil increases. According to the embodiment, the first and second coils C1 and C2 each have the increased length Lpc in the Z-direction (see FIG. 1). For example, the first coil C1 extends from the front surface 30F of the second insulating film 30 into the first insulating film 20.

A method for manufacturing the isolator 1 will now be described with reference to FIGS. 3A to 4B. FIGS. 3A to 4B are schematic cross-sectional views showing manufacturing processes of the isolator 1 according to the embodiment.

Figure 3A:
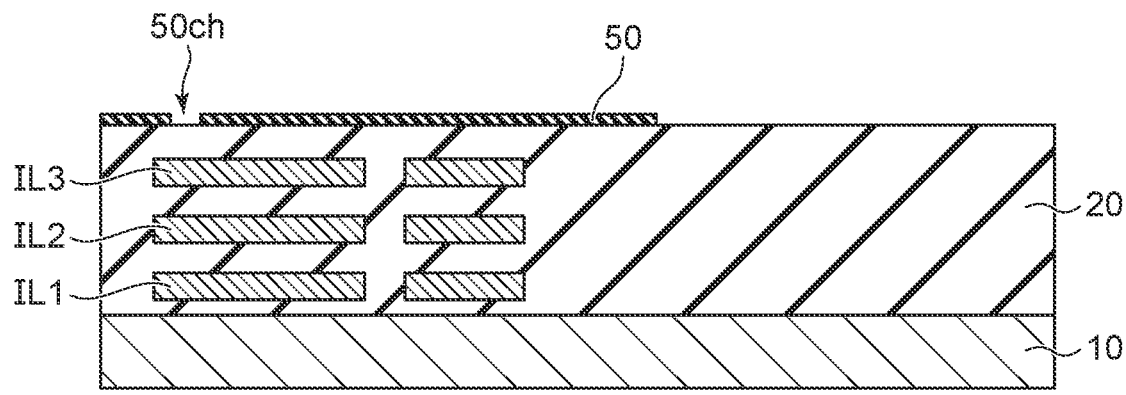
FIGS. 3A to 4B are schematic cross-sectional views showing manufacturing processes of the isolator according to the embodiment.
Figure 3A:
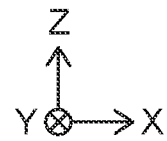

As shown in FIG. 3A, the fourth insulating film 50 is formed on the first insulating film 20. The first insulating film 20 is an inter-layer insulating film provided on the substrate 10. The first insulating film 20 includes the multiple interlayer interconnects IL1 to IL3. The first insulating film 20 is, for example, a silicon oxide film formed using CVD (Chemical Vapor Deposition).

The fourth insulating film 50 is, for example, a silicon nitride film. The fourth insulating film 50 is formed using, for example, CVD. The fourth insulating film 50 is selectively removed by, for example, wet etching using an etching mask (not-illustrated). The fourth insulating film 50 is selectively removed in a region at which the first coil C1 is to be provided (see FIG. 1). Moreover, the fourth insulating film 50 is partially removed to have an opening 50ch positioned above the interlayer interconnect IL3.

Figure 3B:
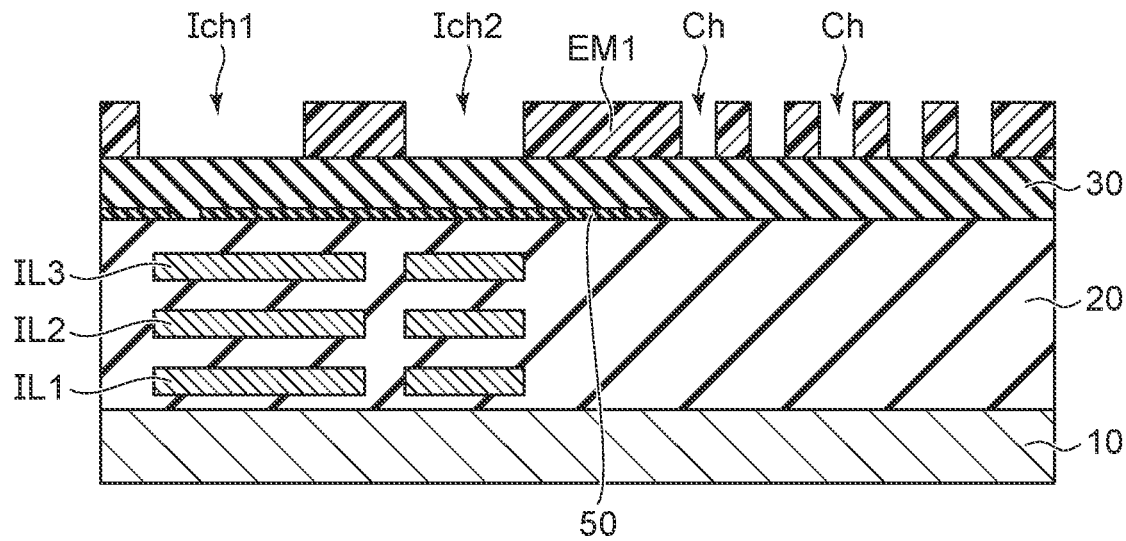
Figure 3B:
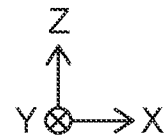

As shown in FIG. 3B, the second insulating film 30 is formed on the first and fourth insulating films 20 and 50. The second insulating film 30 is, for example, a silicon oxide film. The second insulating film 30 is formed using, for example, CVD.

An etching mask EM1 is formed on the second insulating film 30. The etching mask EM1 is, for example, a resist mask formed using photolithography. The etching mask EM1 includes an opening Ch on the region at which the first coil C1 is to be provided. The opening Ch has, for example, the same planar shape as the planar shape of the first coil C1

(see FIG. 2). The etching mask EM1 also includes a first opening Ich1 and a second opening Ich2 positioned above the interlayer interconnect IL3. The first opening Ich1 has the same planar shape as the shape of the first interconnect IC1 (see FIG. 2); and the second opening Ich2 has the same planar shape as the shape of the second interconnect IC2 (see FIG. 2).

Figure 4A:
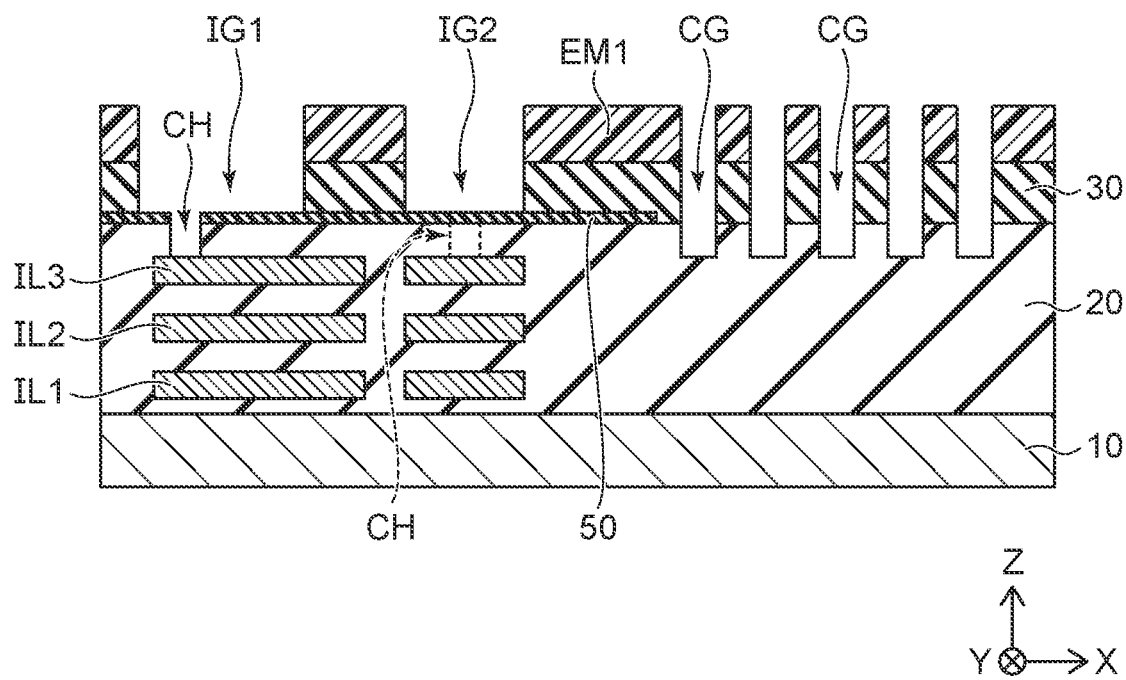

As shown in FIG. 4A, the second insulating film 30 and the first insulating film 20 are selectively etched using the etching mask EM1. The first insulating film 20 and the second insulating film 30 are selectively removed by, for example, dry etching.

A coil trench CG is formed via the opening Ch of the etching mask EM1 in the region at which the first coil C1 is to be formed. The coil trench CG is formed to extend from the front surface 30F of the second insulating film 30 into the first insulating film 20.

There may be a case, for example, where the coil trench CG is not formed with the intended depth due to the etching nonuniformity in the wafer surface. Therefore, the first insulating film 20 is preferably provided without a conductive member interposed between the coil trench CG and the substrate 10 in. In other words, it is possible in the first insulating film 20 to prevent the first coil C1 from electrical shorting by contacting the conductive member.

A first interconnect trench IG1 and a second interconnect trench IG2 are formed via the first and second openings Ich1 and Ich2 of the etching mask EM1 in other regions at which the first interconnect IC1 and the second interconnect IC2 are to be provided. The fourth insulating film 50 is exposed at the bottom surfaces of the first and second interconnect trenches IG1 and IG2. In other words, the etching is stopped by the fourth insulating film 50 in the region at which the first interconnect IC1 and the second interconnect IC2 are to be provided. Therefore, the first and second interconnect trenches IG1 and IG2 have depths less than the depth of the coil trench CG.

The first insulating film 20 is selectively removed at the bottom surface of the first interconnect trench IG1 via the opening 50ch formed in the fourth insulating film 50. The contact hole CH that communicates from the first interconnect trench IG1 to the interlayer interconnect IL3 is formed thereby. Simultaneously, another contact hole CH also is formed so that communicating from the second interconnect trench IG2 to another interlayer interconnect IL3.

Figure 4B:
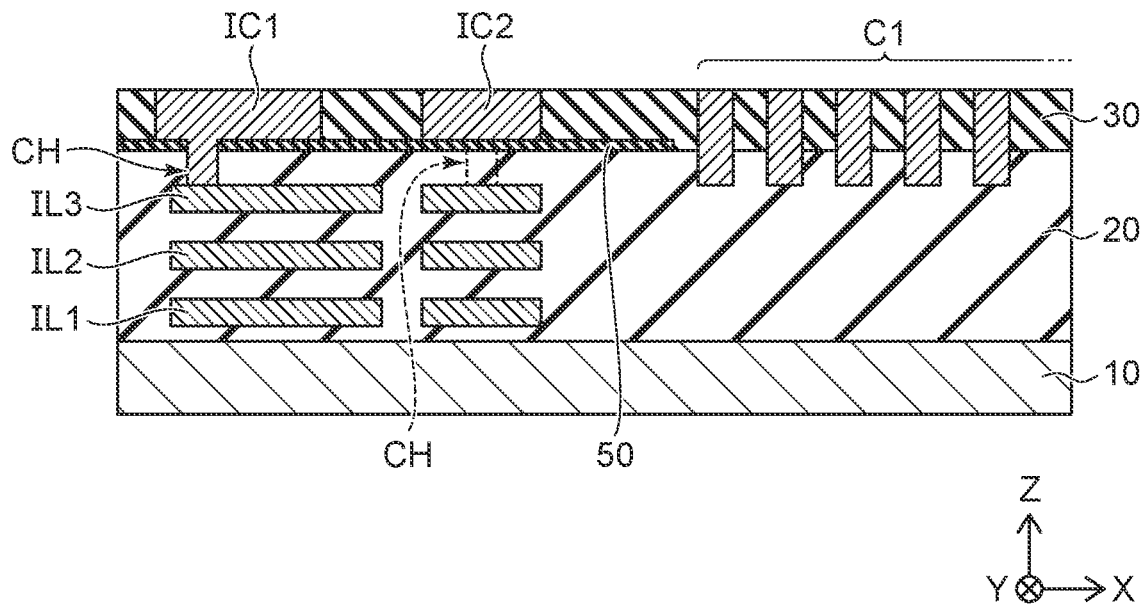

As shown in FIG. 4B, the first coil C1, the first interconnect IC1, and the second interconnect IC2 are formed respectively in the coil trench CG, the first interconnect trench IG1, and the second interconnect trench IG2. The first interconnect IC1 is connected to the interlayer interconnect IL3 via the contact hole CH. The second interconnect IC2 is connected to the other interlayer interconnect IL3 via the other contact hole CH.

The first coil C1, the first interconnect IC1, and the second interconnect IC2 are formed by selectively removing a conductive layer filling the coil trench CG, the first interconnect trench IG1, and the second interconnect trench IG2 (see FIG. 5B) so that the portions formed in the trenches remain.

Thus, the first interconnect IC1 and the second interconnect IC2 may be referred to as so-called damascene interconnects. While forming the first and second interconnects IC1 and IC2, there is preferably the large difference between the etching rate of the second insulating film 30 and the etching rate of the fourth insulating film 50.

For example, due to the etching nonuniformity of the second insulating film 30 in the wafer surface, the exposed period of the fourth insulating film 50 to the etching atmosphere also becomes nonuniform. As the exposed period of the fourth insulating film 50 to the etching atmosphere lengthens, the first insulating film 20 that is the lower layer is exposed after the fourth insulating film 50 is removed. When the difference is small between the etching rate of the second insulating film 30 and the etching rate of the fourth insulating film 50, the tolerance range of the etching time in which the fourth insulating film 50 can be exposed to the etching atmosphere is small. Therefore, the first insulating film 20 is unintentionally etched, resulting in a larger risk of the electrical shorting between the interlayer interconnect IL3 and the first interconnect IC1 or the second interconnect IC2.

In the isolator 1, for example, a silicon oxide film is used as the second insulating film 30; and, for example, a silicon nitride film is used as the fourth insulating film 50. The etching easily performed in which the etching rate of the silicon nitride film is sufficiently slower than the etching rate of the silicon oxide film.

On the other hand, in the manufacturing processes of the isolator 1, the internal stress of the insulating films is preferably reduced between the first coil C1 and the second coil C2. For this purpose, for example, a SiON film may be used as the second insulating film 30 instead of the silicon oxide film. The stress inside the insulating film may be reduced thereby. However, the difference between the etching rate of the second insulating film and the etching rate of the fourth insulating film 50 is reduced, and there is a risk of lower yield due to the electrical shorting between the interlayer interconnect IL3 and the first interconnect IC1 or the second interconnect IC2. That is, the materials of the second and fourth insulating films 30 and 50 are preferably selected to increase the etching rate difference.

Figure 5A:
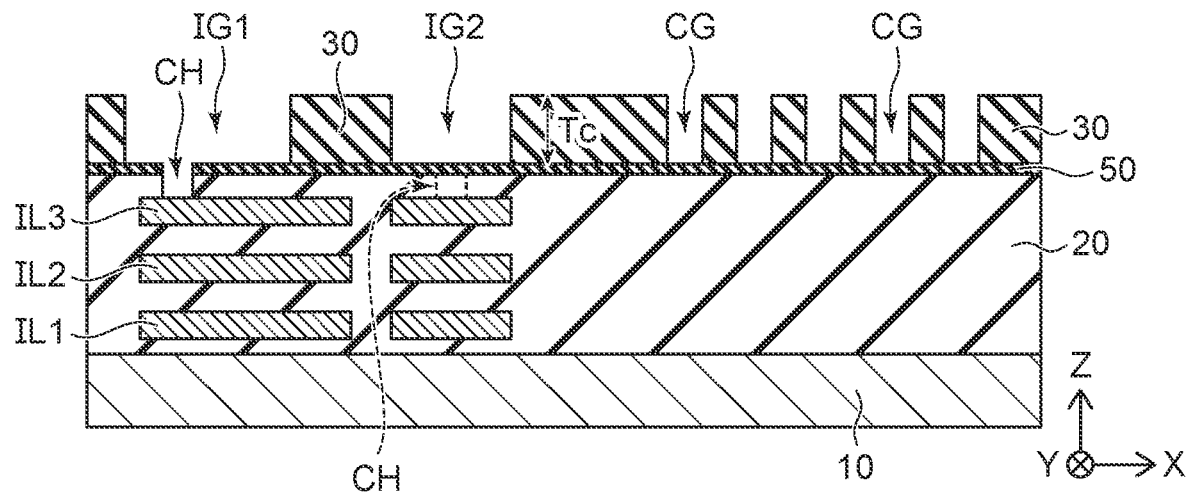
FIGS. 5A to 5C are schematic cross-sectional views showing manufacturing processes of an isolator according to a comparative example.
Figure 5B:
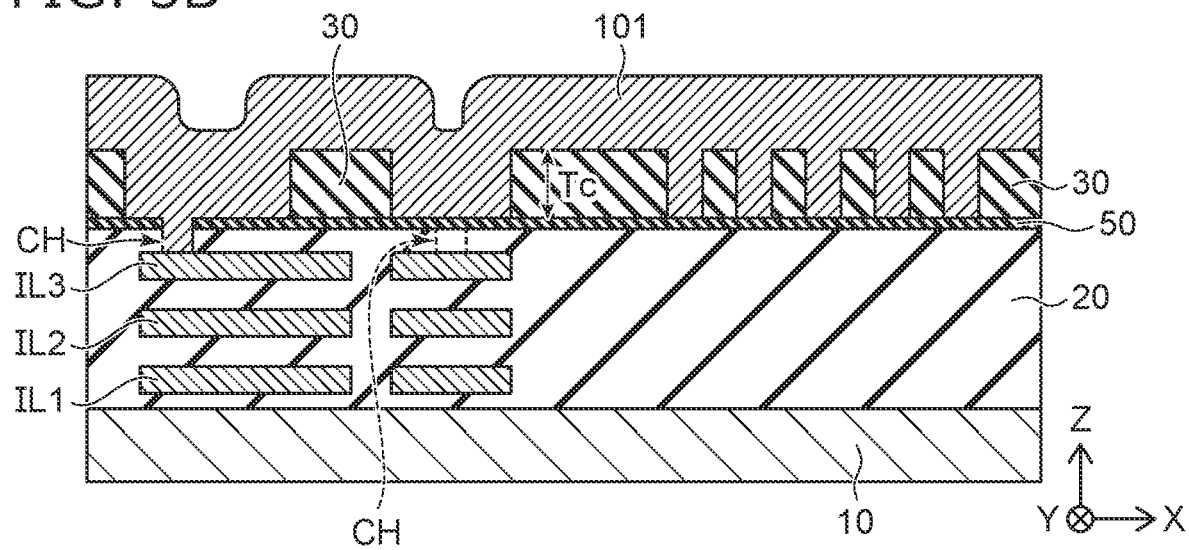
Figure 5C:
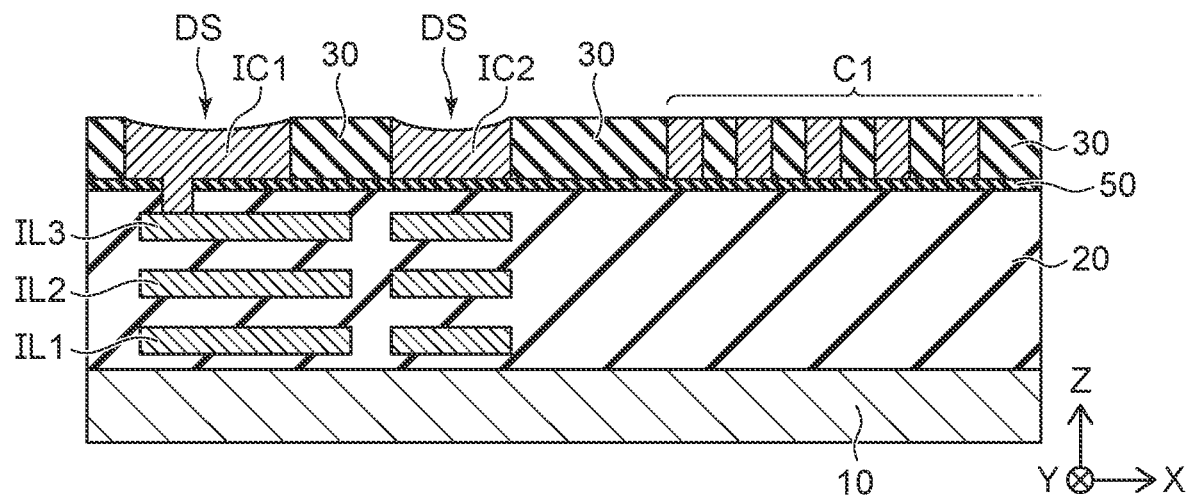

FIGS. 5A to 5C are schematic cross-sectional views showing manufacturing processes of an isolator according to a comparative example. FIGS. 5A to 5C are cross-sectional views corresponding to the cross section along line A-A shown in FIG. 2.

As shown in FIG. 5A, the fourth insulating film 50 covers the entire upper surface of the first insulating film 20. The second insulating film 30 is formed on the fourth insulating film 50 and includes the coil trench CG, the first interconnect trench IG1, and the second interconnect trench IG2. The fourth insulating film 50 is exposed at the bottom surfaces of the trenches. The contact holes CH are formed at the bottom surfaces of the first and second interconnect trenches IG1 and IG2.

In such a case, the second insulating film 30 is formed so that the film thickness Tc in the Z-direction is equal to the length Lpc in the Z-direction of the first coil C1. Accordingly, the first interconnect trench IG1 and the second interconnect trench IG2 each have a depth deeper than those of the example shown in FIG. 4A.

As shown in FIG. 5B, a conductive layer 101 is formed to fill the coil trench CG, the first interconnect trench IG1, and the second interconnect trench IG2. The conductive layer 101 is, for example, a metal layer that includes copper. The conductive layer 101 is formed by, for example, plating.

As shown in FIG. 5C, the first coil C1, the first interconnect IC1, and the second interconnect IC2 are formed inside the coil trench CG, the first interconnect trench IG1, and the second interconnect trench IG2, respectively. The first coil C1, the first interconnect IC1, and the second interconnect IC2 are formed by selectively removing the conductive layer 101 so that the portions filled into the trenches remain.

The conductive layer 101 is removed using, for example, CMP (Chemical Mechanical Polishing). At this time, the first and second interconnects IC1 and IC2 are formed with recesses, so-called dishing DS, are formed at the upper surface side thereof because the first and second interconnect trenches IG1 and IG2 have the large widths in the X-direction.

As the trench depths of the first and second interconnect trenches IG1 and IG2 increase, the conductive layer 101 has a large thickness enough to fill the trenches, and the time for completely removing the conductive layer 101 on the second insulating film 30 increases. Therefore, due to nonuniformity of the polishing amount of CMP, the dishing DS becomes deep in the region in which the conductive layer 101 on the second insulating film 30 is quickly removed, and CMP residue easily remains inside the deep dishing DS. Therefore, impurities due to the CMP residue are diffused into the third insulating film 40 covering the first interconnect IC1 and the second interconnect IC2; and discrepancies such as reducing the breakdown voltage, etc., occur.

In the isolator 1 according to the embodiment, the first interconnect trench IG1 and the second interconnect trench IG2 are provided with the thickness less than the depth of the coil trench CG, and thereby, it is possible to reduce the layer thickness of the conductive layer 101. Therefore, the CMP time can be reduced, and the dishing DS can be suppressed. Thus, the breakdown voltage can be increased between the first coil C1 and the second coil C2.

A semiconductor device according to the embodiments includes the following aspects;

Note 1: An isolator, comprising:
a substrate;
a first insulating film provided on the substrate;
a second insulating film provided on the first insulating film, the second insulating film including a back surface and a front surface, the back surface facing the first insulating film, a front surface being at a side opposite to the back surface;
a first interconnect provided in the second insulating film, a thickness of the first interconnect being equal to a film thickness of the second insulating film in a first direction directed toward the second insulating film from the substrate;
a first coil extending in the second insulating film and the first insulating film, the first coil having a length in the first direction from the front surface of the second insulating film into the first insulating film, the length in the first direction of the first coil being greater than the thickness in the first direction of the first interconnect;
a third insulating film provided on the second insulating film, the third insulating film covering the first interconnect and the first coil, the third insulating film including a back side and a front side opposite to the back side, the back side of the third insulating film facing the second insulating film; and
a second coil provided at the front side of the third insulating film, the second coil facing the first coil via the third insulating film.

Note 2: The isolator according to note 1, further comprising a fourth insulating film provided between the first insulating film and the second insulating film, wherein the first interconnect extends through the second insulating film and contacts the fourth insulating film.

Note 3: The isolator according to note 2, wherein the fourth insulating film is different in a composition from the first insulating film and the second insulating film.

Note 4: The isolator according to note 2 or 3, wherein the fourth insulating film is provided without contacting the first coil.

Note 5. The isolator according to any one of notes 2 to 4, further comprising interlayer interconnects provided in the first insulating film and positioned between the substrate and the first interconnect, wherein the first interconnect is connected to at least one of the interlayer interconnects via a contact hole provided in the first and fourth insulating films.

Note 6: The isolator according to note 5, wherein the first insulating film is provided without a conductive member other than the interlayer interconnects, and the interlayer interconnects are not located between the substrate and the first coil.

Note 7: The isolator according to any one of notes 1 to 6, wherein the third insulating film is different in a composition from the second insulating film.

Note 8: The isolator according to any one of notes 1 to 7, wherein the first interconnect has a width in a second direction along the front surface of the second insulating film, the width of the first interconnection being greater than a line width in the second direction of the first coil.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and overview of the invention.

What is claimed is:

1. An isolator, comprising:
a substrate;
a first insulating film provided on the substrate;
a second insulating film provided on the first insulating film, the second insulating film including a back surface and a front surface, the back surface facing the first insulating film, a front surface being at a side opposite to the back surface;
a first interconnect provided in the second insulating film, a thickness of the first interconnect being equal to a film thickness of the second insulating film in a first direction directed toward the second insulating film from the substrate;
a first coil extending in the second insulating film and the first insulating film, the first coil having a length in the first direction from the front surface of the second insulating film into the first insulating film, the length in the first direction of the first coil being greater than the thickness in the first direction of the first interconnect;
a third insulating film provided on the second insulating film, the third insulating film covering the first interconnect and the first coil, the third insulating film including a back side and a front side opposite to the back side, the back side of the third insulating film facing the second insulating film;
a second coil provided at the front side of the third insulating film, the second coil facing the first coil via the third insulating film; and
a fourth insulating film provided between the first insulating film and the second insulating film,
the first interconnect extending through the second insulating film and contacting the fourth insulating film, wherein
the fourth insulating film is provided without contacting the first coil.

2. The isolator according to claim 1, further comprising:
interlayer interconnects provided in the first insulating film and positioned between the substrate and the first interconnect,
the first interconnect being connected to at least one of the interlayer interconnects via a contact hole provided in the first and fourth insulating films.

3. The isolator according to claim 2, wherein
the interlayer interconnects are not located between the substrate and the first coil.

4. The isolator according to claim 1, wherein
the third insulating film is different in a composition from the second insulating film.

5. An isolator, comprising:
a substrate;
a first insulating film provided on the substrate;
a second insulating film provided on the first insulating film, the second insulating film including a back surface and a front surface, the back surface facing the first insulating film, a front surface being at a side opposite to the back surface;
a first interconnect provided in the second insulating film, a thickness of the first interconnect being equal to a film thickness of the second insulating film in a first direction directed toward the second insulating film from the substrate;
a first coil extending in the second insulating film and the first insulating film, the first coil having a length in the first direction from the front surface of the second insulating film into the first insulating film, the length in the first direction of the first coil being greater than the thickness in the first direction of the first interconnect;
a third insulating film provided on the second insulating film, the third insulating film covering the first interconnect and the first coil, the third insulating film including a back side and a front side opposite to the back side, the back side of the third insulating film facing the second insulating film; and
a second coil provided at the front side of the third insulating film, the second coil facing the first coil via the third insulating film,
wherein
the third insulating film includes a plurality of sub-insulating films stacked in the first direction, and
one of the sub-insulating films having a film thickness in the first direction greater than film thicknesses in the first direction of other sub-insulating films, the one of the sub-insulating films being different in a composition from the first insulating film and the second insulating film.

6. The isolator according to claim 5, further comprising:
a fourth insulating film provided between the first insulating film and the second insulating film,
the first interconnect extending through the second insulating film and contacting the fourth insulating film,
wherein
the fourth insulating film is provided without contacting the first coil.

7. The isolator according to claim 6, further comprising:
interlayer interconnects provided in the first insulating film and positioned between the substrate and the first interconnect,
the first interconnect being connected to at least one of the interlayer interconnects via a contact hole provided in the first and fourth insulating films.

8. The isolator according to claim 7, wherein
the interlayer interconnects are not located between the substrate and the first coil.

9. An isolator, comprising:
a substrate;
a first insulating film provided on the substrate;
a second insulating film provided on the first insulating film, the second insulating film including a back surface and a front surface, the back surface facing the first insulating film, a front surface being at a side opposite to the back surface;
a first interconnect provided in the second insulating film, a thickness of the first interconnect being equal to a film thickness of the second insulating film in a first direction directed toward the second insulating film from the substrate;
a first coil extending in the second insulating film and the first insulating film, the first coil having a length in the first direction from the front surface of the second insulating film into the first insulating film, the length in the first direction of the first coil being greater than the thickness in the first direction of the first interconnect;
a third insulating film provided on the second insulating film, the third insulating film covering the first interconnect and the first coil, the third insulating film including a back side and a front side opposite to the back side, the back side of the third insulating film facing the second insulating film;
a second coil provided at the front side of the third insulating film, the second coil facing the first coil via the third insulating film; and
a second interconnect provided in the second insulating film, the second interconnect having a thickness in the first direction equal to the film thickness of the second insulating film; and
an upper layer terminal provided on the front side of the third insulating film, the upper layer terminal being apart from the second coil,
the second interconnect being provided between the first interconnect and the first coil, the second interconnect being apart from the first interconnect and the first coil,
the first interconnect being electrically connected to the upper layer terminal via a contact plug extending in the third insulating film.

10. The isolator according to claim 9, further comprising:
a fourth insulating film provided between the first insulating film and the second insulating film,
the first interconnect extending through the second insulating film and contacting the fourth insulating film,
wherein
the fourth insulating film is provided without contacting the first coil.

11. The isolator according to claim 10, further comprising:
interlayer interconnects provided in the first insulating film and positioned between the substrate and the first interconnect,
the first interconnect being connected to at least one of the interlayer interconnects via a contact hole provided in the first and fourth insulating films.

12. The isolator according to claim 11, wherein the interlayer interconnects are not located between the substrate and the first coil.

\* \* \* \* \*